(12) United States Patent
Klauk et al.

(10) Patent No.: US 7,208,782 B2
(45) Date of Patent: Apr. 24, 2007

(54) REDUCTION OF THE CONTACT RESISTANCE IN ORGANIC FIELD-EFFECT TRANSISTORS WITH PALLADIUM CONTACTS BY USING PHOSPHINES AND METAL-CONTAINING PHOSPHINES

(75) Inventors: Hagen Klauk, Erlangen (DE); Günter Schmid, Hemhofen (DE); Ute Zschieschang, Erlangen (DE); Marcus Halik, Erlangen (DE); Efstratios Terzoglu, Erlangen (DE)

(73) Assignee: Infineon Technologies, AG, Munich (DE)

( * ) Notice: Subject to any disclaimer, the term of this patent is extended or adjusted under 35 U.S.C. 154(b) by 2 days.

(21) Appl. No.: 11/045,511

(22) Filed: Jan. 31, 2005

(65) Prior Publication Data

US 2005/0167703 A1 Aug. 4, 2005

Related U.S. Application Data

(63) Continuation of application No. PCT/DE03/02379, filed on Jul. 15, 2003.

(30) Foreign Application Priority Data

Jul. 31, 2002 (DE) .............................. 102 34 997.5

(51) Int. Cl.
*H01L 27/148* (2006.01)
(52) U.S. Cl. ..................... 257/225; 257/40; 257/E51.03
(58) Field of Classification Search ................ 257/225, 257/E51.03, 40
See application file for complete search history.

(56) References Cited

U.S. PATENT DOCUMENTS

| | | | |
|---|---|---|---|
| 5,888,662 A | 3/1999 | Gorsuch et al. | |
| 5,903,101 A | 5/1999 | Kijima | |
| 6,094,395 A | 7/2000 | Weinfurtner | |
| 6,335,539 B1 * | 1/2002 | Dimitrakopoulos et al. | .. 257/40 |
| 6,580,127 B1 * | 6/2003 | Andry et al. | ................ 257/347 |
| 6,661,728 B2 | 12/2003 | Tomita et al. | |

FOREIGN PATENT DOCUMENTS

| | | |
|---|---|---|
| GB | 2 379 085 A | 2/2003 |
| WO | WO 01/01502 A2 | 1/2001 |

OTHER PUBLICATIONS

Ioannis Kymissis, "High-Performance Bottom Electrode Organic Thin-Film Transistors", IEEE Transactions on Electron Devices, vol. 48, No. 6, Jun. 2001, pp. 1060-1064.

* cited by examiner

*Primary Examiner*—N. Drew Richards
*Assistant Examiner*—Mohammad Timor Karimy
(74) *Attorney, Agent, or Firm*—Edell, Shapiro & Finnan, LLC

(57) ABSTRACT

A semiconductor device includes a semiconductor path, the semiconductor path including an organic semiconductor material, a first contact to inject charge carriers into the semiconductor path, a second contact to extract charge carriers from the semiconductor path, and a layer including phosphine arranged between the first contact and the semiconductor path and/or between the second contact and the semiconductor path. The phosphine in the layer acts as a charge transfer molecule which makes it easier to transfer charge carriers between contact and organic semiconductor material. As a result, the contact resistance between contact and organic semiconductor material can be reduced considerably.

5 Claims, 1 Drawing Sheet

REDUCTION OF THE CONTACT RESISTANCE IN ORGANIC FIELD-EFFECT TRANSISTORS WITH PALLADIUM CONTACTS BY USING PHOSPHINES AND METAL-CONTAINING PHOSPHINES

CROSS REFERENCE TO RELATED APPLICATIONS

This application is a continuation of PCT/DE03/02379, filed Jul. 15, 2003, and titled "Reduction of the Contact Resistance in Organic Field Effect Transistors Comprising Palladium Contacts by the Use of Phosphines and Phosphines Containing Metal," which claims priority under 35 U.S.C. § 119 to German Application No. DE 102 34 997.5, filed on Jul. 31, 2002, and titled "Reduction of the Contact Resistance in Organic Field Effect Transistors Comprising Palladium Contacts by the Use of Phosphines and Phosphines Containing Metal," the entire contents of which are hereby incorporated by reference.

FIELD OF THE INVENTION

The invention relates to a semiconductor device having a semiconductor path comprising an organic semiconductor material, a first contact for injecting charge carriers into the semiconductor path and a second contact for extracting charge carriers from the semiconductor path, and to a method for fabricating a semiconductor device of this type.

BACKGROUND

Semiconductor chips have gained widespread acceptance in a wide range of technical fields. However, they are still highly complex and expensive to produce. Although silicon substrates can be thinned to very low layer thicknesses, so that they become flexible, these processes are likewise very expensive, meaning that flexible or curved microchips are only suitable for demanding applications for which high costs can be accepted. The use of organic semiconductors offers the option of inexpensive fabrication of microelectronic semiconductor circuits on flexible substrates. One example of a possible application is a thin film with integrated control elements for liquid crystal displays. A further possible application is transponder technology, in which, for example, information about a product is stored on what are known as tags.

Field-effect transistors are used as switches in electronic circuits. In this case, in the off state of the transistor, a semiconductor that is arranged between a source electrode and a drain electrode, which are each composed of an electrically conductive material, acts as an insulator, while under the influence of the field of a gate electrode a charge carrier channel is formed in the on state of the transistor. In this case, electrical charge carriers are injected into the semiconductor layer at the source contact and are extracted from the semiconductor layer at the drain contact, so that an electric current flows from source to drain through the semiconductor layer or through the charge channel produced in the semiconductor layer.

On account of the different Fermi levels of semiconductor material and contact material, an asymmetric charge carrier diffusion process occurs at the contact surface between the two materials. On account of the different energy of the Fermi levels of the two materials, there is an energy difference which is compensated for by the transfer of charge carriers. As a result, an interface potential is built up which, when an external potential difference is applied, counteracts a transfer of the charge carriers between the two layers. Therefore, the result is a potential barrier which has to be overcome by the charge carriers when entering the semiconductor material from the electrically conductive contact or when leaving the semiconductor material to pass into the electrically conductive contact. The higher or wider the potential barrier, the lower the tunneling current which is formed as a result of the charge carriers tunneling through the potential barrier. A low tunneling current corresponds to a high contact resistance. In the case of semiconductor components based on inorganic semiconductors, an increase in the contact resistance is combated by doping the inorganic semiconductor in a boundary layer oriented toward the contact surface. The doping changes the energy of the Fermi level in the inorganic semiconductor, i.e. the difference between the Fermi levels of contact material and semiconductor material is reduced. The result is either a reduction in the potential barrier, allowing a significantly greater number of charge carriers to overcome the potential barrier and to swamp the opposite material, or a narrowing of the potential barrier, which increases the probability of charge carrier tunneling through the potential barrier. In both cases, the contact resistance is reduced.

For the fabrication of field-effect transistors based on amorphous or polycrystalline silicon layers, the contact regions are doped by the introduction of phosphorus or boron into the layer of silicon close to the source and drain contacts. The phosphorus or boron atoms are incorporated in the silicon network and act as charge donors or charge acceptors, with the result that the density of the free charge carriers and therefore the electrical conductivity of the silicon is increased in the doped region. This reduces the difference between the Fermi levels of contact material and doped semiconductor material. The doping substance is in this case introduced into the silicon only in the region of the source and drain contacts but not in the channel region, in which a charge carrier channel is formed under the influence of the field of the gate electrode. Since phosphorus and boron form covalent bonds with the silicon, there is no risk of these atoms diffusing into the channel region, and consequently a low electrical conductivity continues to be ensured in the channel region.

If the contact regions are sufficiently highly doped, the tunneling probability even in the quiescent state is so high that the junction between the contact material and the inorganic semiconductor material loses its blocking capacity and applies a good conductivity in both directions.

Field-effect transistors based on organic semiconductors are of interest for a wide range of electronic applications which require extremely low manufacturing costs, flexible or unbreakable substrates or require transistors and integrated circuits to be fabricated over large active surfaces. By way of example, organic field-effect transistors are suitable as pixel control elements in active matrix displays. Displays of this type are usually produced with field-effect transistors based on amorphous or polycrystalline silicon layers. The temperatures of usually more than 250° C. which are required to fabricate high-quality transistors based on amorphous or polycrystalline silicon layers require the use of rigid and fragile glass or quartz substrates. On account of the relatively low temperatures at which transistors based on organic semiconductors are fabricated, usually of less than 100° C., organic transistors make it possible to produce active matrix displays using inexpensive, flexible, transparent, unbreakable polymer films, which is associated with considerable advantages compared to glass or quartz substrates.

A further application area for organic field-effect transistors lies in the fabrication of very inexpensive integrated circuits, as are used for example for the active labeling and identification of goods and products. These transponders, as they are known, are usually produced using integrated circuits based on single-crystalline silicon, which entails considerable costs in construction and connection technology. The production of transponders on the basis of organic transistors would lead to enormous cost reductions and could help transponder technology to achieve a world-wide breakthrough.

One of the main problems of using organic field-effect transistors is the relatively poor electrical properties of the source and drain contacts, i.e. their high contact resistances. The source and drain contacts of organic transistors are generally produced using inorganic metals or with the aid of conductive polymers, in order in this way to ensure the highest possible electrical conductivity of the contacts. Most organic semiconductors which are suitable for use in organic field-effect transistors have very low electrical conductivities. For example, pentacene, which is often used to fabricate organic field-effect transistors, has a very low electrical conductivity of $10^{-14}\ \Omega^{-1}\ cm^{-1}$. If the organic semiconductor has a low electrical conductivity, there is a considerable difference between the Fermi levels of electrically conductive contact material and organic semiconductor material at the contact surface. This leads to the formation of a high potential barrier with a low tunneling probability for the passage of charge carriers. Therefore, source and drain contacts often have high contact resistances, and consequently high electric field strengths are required at the contacts for charge carriers to be injected and extracted. Therefore, it is not the conductivity of the contact itself, but rather the low conductivity of the semiconductor regions which adjoin the contacts and into which the charge carriers are injected and from which the charge carriers are extracted which constitutes a limitation.

To improve the electrical properties of the source and drain contacts, therefore, it is desirable to achieve a high electrical conductivity of the organic semiconductor in the regions which adjoin the contacts, in order to reduce the difference in the Fermi levels between organic semiconductor and contact material and thereby to lower the contact resistances. On the other hand, a high electrical conductivity of the organic semiconductor in the channel region has an adverse effect on the properties of the transistor. A significant electrical conductivity in the channel region inevitably leads to high leakage currents, i.e. to relatively high electric current intensities in the off state of the field-effect transistor. For many applications, low leakage currents in the region of $10^{-12}$ A or below are imperative. Moreover, a high electrical conductivity leads to the ratio between the maximum switch-on current and the minimum switch-off current becoming too low. Many applications require the ratio between switch-on current and switch-off current to be as high as possible, in the region of $10^7$ or above, since this ratio reflects the modulation behavior and the gain of the transistor. Therefore, a low electrical conductivity of the organic semiconductor is required in the channel region, while a high electrical conductivity is required in the region of the source and drain contacts, in order to improve the contact properties between organic semiconductor material and the material of the contacts.

As with inorganic semiconductors, the electrical conductivity of many organic semiconductors can be increased by the introduction of suitable doping substances. However, there are problems with obtaining positional selectivity during doping. The doping substances are not bound to a specific position in the organic semiconductors and can move freely within the material. Even if the doping process can originally be restricted to a specific region, for example the regions around the source and drain contacts, the doping substances subsequently migrate through the entire semiconductor layer, particularly under the influence of the electric field which is applied between the source contact and the drain contact in order to operate the transistor. The diffusion of the doping substance within the organic semiconductor layer inevitably increases the electrical conductivity in the channel region.

I. Kymissis, C. D. Dimitrakopoulos and S. Purushothaman, "High-Performance Bottom Electrode Organic Thin-Film Transistors" IEEE Transactions on Electron Devices, Vol. 48, No. 6, June 2001, pp. 1060–1061, describe a semiconductor device with a reduced contact resistance, in which first of all a monomolecular layer of 1-hexadecanethiol is applied to chromium/gold electrodes, and then a layer of pentacene as organic semiconductor material is applied to the monomolecular layer of 1-hexadecanethiol. This arrangement makes it possible to significantly reduce the contact resistance to charge transfer of the charge carriers between electrode and semiconductor path. The molecules of 1-hexadecanethiol which are arranged at the interface between contact and organic semiconductor act as charge transfer molecules. They are in direct contact with both the contact material and the organic semiconductor layer. On account of their molecular structure, the charge transfer molecules can force a transfer of charge carriers between the contact material, in which there is an excess of charge carriers, and the organic semiconductor layer, in which there is a deficit of charge carriers. In this way, in the region of the source and drain contacts an excess of charge carriers can be produced in the organic semiconductor layer, with the result that the contact resistance is significantly reduced. The thiol groups of the 1-hexadecanethiol form a covalent bond with the surface of the gold contacts, resulting in local fixing of the molecules. Therefore, even under the action of a field applied between source and drain electrodes, the charge transfer molecules do not migrate in those sections of the organic semiconductor path in which the channel region is formed.

However, gold has the drawback of generally bonding very poorly to inorganic layers, such as for example to silicon dioxide. To improve the bonding of the gold contacts, therefore, a thin film of chromium or titanium as a bonding agent is often applied immediately before the deposition of the layer of gold. However, this has the drawback of making the patterning of the metal layer which is required in order to produce the contact structures more difficult. Furthermore, thiols are also only suitable as charge transfer molecules for certain metals, such as gold, since it is not possible to achieve a sufficient bonding strength to all metals which are suitable for the production of contacts to prevent the thiols from diffusing out of the boundary layer between contact and semiconductor material.

SUMMARY OF THE INVENTION

Therefore, it is an object of the invention to provide a semiconductor device having a semiconductor path comprising an organic semiconductor material, a first contact for injecting charge carriers into the semiconductor path and a second contact for extracting charge carriers from the semiconductor path which has a low contact resistance for the transfer of charge carriers between contact and semiconductor path.

In accordance with the invention, a semiconductor device is formed with a layer including phosphine being arranged between the first contact and the semiconductor path and/or between the second contact and the semiconductor path.

The above and still further objects, features and advantages of the present invention will become apparent upon consideration of the following detailed description of specific embodiments thereof, particularly when taken in conjunction with the accompanying drawings where like numerals designate like components.

DETAILED DESCRIPTION OF THE PREFERRED EMBODIMENTS

Figure 1A:
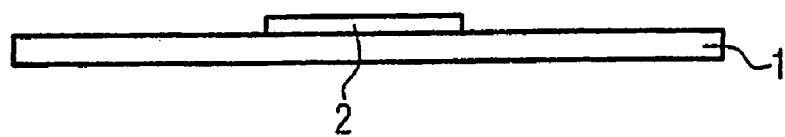
FIGS. 1A–1E depict various stages during the formation of a field-effect transistor of a semiconductor device according to the invention.
Figure 1B:

A semiconductor device is formed in accordance with the invention including a layer (e.g., a monomolecular layer) of a phosphine being arranged between the first contact and the semiconductor path and/or between the second contact and the semiconductor path.

Phosphines can form extremely stable complexes with a large number of metals which are used as material for contacts in the semiconductor devices described above. If the phosphine is applied to the surface of the contacts which subsequently forms the contact surface with respect to the semiconductor path, the molecules are coordinated to the surface so as to form a complex. On the one hand, this ensures good contact with the material of the contacts, and on the other hand this also ensures that the phosphine molecules are fixed to the contact surface, so that they do not diffuse to the sections of the semiconductor path in which the conduction channel is formed under a field which is applied between source and drain electrodes.

The term "semiconductor path", as used herein, denotes a conduction path between two contacts and that includes an organic semiconductor material. The charge carriers, electrons or holes are injected into the semiconductor path at the first contact, pass through the semiconductor path and are extracted again from the semiconductor path at the second contact.

The organic semiconductor material used may be any suitable organic materials which have semiconductor properties. Examples of suitable compounds include, without limitation, condensed aromatics, such as anthracene, tetracene or pentacene, polymeric aromatic compounds, such as polyvinylenes or polynaphthalene derivatives, electrically semiconducting compounds based on polythiophene, for example poly-3-hexylthiopen-2,5-diyl, or electrically semiconducting compounds based on polyvinylthiophene or polyaniline. In addition to the compounds mentioned, it is also possible to use other organic semiconductor compounds. The organic semiconductor materials may be doped. In this case, however, it should be ensured that the doping does not migrate or diffuse in the organic semiconductor material. The semiconductor path may consist homogeneously of only a single organic semiconductor material. However, it is also possible to provide a semiconductor path which comprises various sections which are each composed of different organic semiconductor materials.

The materials used to produce the semiconductor path of the semiconductor device according to the invention are readily accessible and may in some cases be purchased from commercial suppliers. The organic semiconductor materials or precursors used to produce the organic semiconductor materials are generally readily soluble in organic solvents and can therefore be provided in dissolved form or as a suspension and can be applied to a substrate in liquid form. In this way, the semiconductor path of the semiconductor device according to the invention can be produced, for example, by simple printing processes, making the semiconductor elements significantly easier and less expensive to fabricate. However, the deposition of the organic semiconductor material may also be carried out using other methods, for example by sublimation deposition of the semiconductor material from the vapor phase.

All materials which have a sufficiently high electrical conductivity are suitable for use as material for the contacts. In principle, all metals are suitable, preferably palladium, gold, platinum, nickel, copper, aluminum, as well as electrically conductive oxides, such as for example ruthenium oxide and indium tin oxide, as well as electrically conductive polymers, such as polyacetylene or polyaniline. The material used for the contacts should be able to form a stable bond with the phosphine in order to bond the phosphine to the surface. Metals generally form stable complexes with phosphines, and consequently the contacts are preferably composed of metals.

The first and/or second contact of the semiconductor device is preferably composed of palladium. Like gold, palladium is distinguished by an excellent resistance to oxidation and is likewise easy to deposit and pattern. Compared to gold, however, palladium bonds much more securely to substrates of all types, and consequently the additional use of a bonding agent, such as chromium or titanium, is not required. Phosphines bond very successfully to palladium surfaces, and consequently there is no migration of these compounds in the electric field. If phosphines are applied to palladium, a stable metal complex is formed and therefore the molecules are fixed on the palladium surface by complexing. Thiols are not suitable for fixing on palladium, since the palladium-sulfur bond is significantly weaker than the gold-sulfur bond and there is no local fixing of the molecules on the contact surface.

To achieve the lowest possible contact resistance for the transfer of the charge carriers between contact and semiconductor path, the layer of the phosphine should be designed to be as thin as possible. The layer of the phosphine is preferably formed as a self-organizing monomolecular layer. In this case, the surface of the contact is covered with a monomolecular layer, the phosphine being coordinated to the surface of the contact by means of the phosphorus. If the surface of the contact is completely covered, no further compound is adsorbed and excess phosphine can be rinsed off, for example, using a suitable solvent.

The phosphines that are suitable for the semiconductor device according to the invention include an extremely wide range of structures. The contact resistance which is present with respect to the transfer of charge carriers between contact and semiconductor path can be altered within wide boundaries by varying the structure of the phosphine and in this way can be matched, for example, to the materials of the semiconductor path. Even phosphines of relatively simple structure, such as $PH_3$ or $PF_3$, are suitable. Furthermore, alkylphosphines, in which the alkyl groups bonded to the phosphorus are identical or different and preferably include 1 to 20, more preferably 1 to 8 carbon atoms, are also suitable. Examples of suitable alkyl groups are methyl, ethyl, propyl, butyl, pentyl, hexyl, heptyl and octyl groups which may be straight-chain or branched. Cyclic alkyl groups, for example cyclopentyl or cyclohexyl groups, are also suitable. The alkyl groups can also include one or more carbon—carbon double bonds which are arranged isolated or conjugated with respect to one another. An example of a suitable unsaturated alkyl group (alkenyl group) is the vinyl group. It is also possible for one or more hydrogen atoms in the abovementioned groups to be replaced by halogen atoms, such as fluorine, or pseudo-halides, such as a nitrile group. Another suitable group includes an amino group.

Examples of suitable phosphines include, without limitation, tris(2-cyanoethyl)phosphine or tris(diethylamino)phosphine. Arylphosphines are also suitable, the aryl group being selected, for example, from the group consisting of phenyl, anisyl, p-methylphenyl, p-sulfophenyl. The aryl group bonded to the phosphorus may be identical or different. An example of a suitable aryl phosphine is diphenylphosphinobenzoic acid. It is also possible for one or more of the hydrogen atoms in the aryl groups to be replaced by halogen atoms or pseudo-halides. Examples of aryl groups of this type are fluorophenyl or perfluorophenyl. Furthermore, chelating phosphines with two or more phosphine substituents are also suitable, for example 1,2,bis-(diphenylphosphino)ethane, cis-1,2-bis-(diphenylphosphino)ethylene, bis-(diphenylphospho)methane, 1,1,1-tris(diphenylphosphino methyl)ethane, bis(dimethylphosphino)methane. Furthermore, it is also possible to use phosphines that include both alkyl and aryl groups.

Phosphines form very stable complexes with metals, in particular palladium and platinum. In solution, a reversible equilibrium is established:

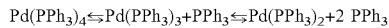

Pd(PPh$_3$)$_4$⇌Pd(PPh$_3$)$_3$+PPh$_3$⇌Pd(PPh$_3$)$_2$+2 PPh$_3$

This equilibrium makes it possible to form a metal—metal bond. Complexes such as Pd(PPh$_3$)$_4$ or Pd(CO)(PPh$_3$)$_3$ are suitable for this reaction. However, this method also allows targeted application of complexes that contain metals other than the metal of the contact. By way of non-limiting example, complexes of platinum or nickel are suitable. Examples of suitable complexes include, without limitation, Pt(PPh$_3$)$_4$ or Pt(CO)(PPh$_3$)$_3$ or NiCl$_2$(dppe)$_2$. In this way, it is also possible to introduce foreign metals into the contact surface between contact and semiconductor path.

The semiconductor arrangement according to the invention can very easily be integrated in more complex components. For example, in a preferred embodiment, the semiconductor device described above is supplemented by a gate electrode and a gate dielectric to form a transistor. The first contact of the semiconductor device then forms the source contact, while the second contact forms the drain electrode. Then, a charge channel in which charge carrier transport takes place is formed between source and drain electrodes under the influence of the field generated by the gate electrode. The same materials as have been described above for the first and second contacts can also be used for the gate electrode. Standard materials can be used to insulate the gate electrode, such as silicon dioxide, aluminum oxide or an insulating polymer, such as polystyrene, polyethylene, polyester, polyurethane, polycarbonate, polyacrylate, polyimide, polyether, polybenzoxazoles or mixtures of these compounds.

The semiconductor element according to the invention can be fabricated at very low cost from readily accessible materials and is therefore suitable in particular for use in devices which are subject to high cost pressures, such as for example RF-ID tags for labeling products.

The invention also relates to a method for fabricating the semiconductor device described above, in which a first and/or a second contact, which has an uncovered contact surface, is provided on a substrate. A phosphine or a metal-containing phosphine derivative is applied to the uncovered contact surface, so that a layer of the phosphine is obtained on the contact surface. Finally, an organic semiconductor material is deposited in such a manner that a semiconductor path comprising the organic semiconductor material is obtained between the first contact and the second contact.

The substrate used in the fabrication of the semiconductor device according to the invention can be an inflexible substrate, such as for example a support made from glass or quartz or, alternatively, a silicon wafer. However, it is preferable to use a flexible substrate such as, for example, a plastic film made of any suitable flexible material. Examples of such flexible materials include, without limitation, polystyrene, polyethylene, polyester, polyurethane, polycarbonate, polyacrylate, polyimide, polyether, polybenzoxazoles and paper. Selected components of the semiconductor device, such as, for example, a gate electrode which is insulated by a corresponding gate dielectric, can also already have been defined on the substrate.

Then, the first and second contacts are defined on the substrate, where standard or conventional methods are used for deposition and patterning. For example, the metal used to form the contacts can be deposited by electron beam vapor deposition or by cathode sputtering. However, it is also possible to employ other methods. The metal layer is then patterned, for example, by photolithographic processes.

The phosphine is then applied to the contacts using any suitable conventional or other processes. For example, the phosphine can be applied from the vapor phase by passing a phosphine-saturated airflow over the surface of the contacts, so that the phosphine molecules are bonded to the surface of the contact. However, it is preferable for the phosphine to be applied to the contacts as a solution. This is advantageous in particular if the phosphine has a very low vapor pressure.

When applying the phosphine as a solution, a phosphine solution is first produced in a suitable solvent, and this solution is then applied to the contacts. As a result of diffusion, the molecules migrate out of the solution to the surface of the contacts, where the molecules are bound to the metal of the contact via the phosphorus to form a metal complex. Excess solvent and phosphine can then be removed, for example by rinsing or by being spun off. The solution of the phosphine can be applied to the contacts using standard methods. By way of example, spraying or dipping methods are suitable. It is also possible for the solution of the phosphine to be spun onto the surface of the substrate and of the contacts, with phosphine molecules being selectively bonded to the surface of the metallic contacts. Finally, it is also possible for the phosphine to be applied to the contacts by means of a printing process. After the solution of the phosphine has been printed onto the contacts, excess solvent is then removed, for example, by evaporation. To ensure that the layer of the phosphine is not too thick, it is necessary to work with suitably dilute solutions. In this context, the term "solution" refers to any combination of phosphine with a solution and thus refers to a broad range of solutions including, without limitation, solutions in which phosphine is completely dissolved in solution, solutions in which phosphine is not completely dissolved as a clear solution, and solutions provided in a pasty form. The requirements imposed on the consistency of the solution are substantially determined by the requirements which result from the process used to apply the solution to the surfaces of the contacts.

Finally, the organic semiconductor is deposited, so that a semiconductor path between the first and second contacts is obtained. Once again, standard processes are used for this step. For example, pentacene can be deposited by sublimation in vacuum. However, it is also possible for the organic semiconductor to be applied in dissolved form. By way of example, a solution of R,R-poly-3-hexylthiophene in chloroform is suitable. For this purpose, the solution of the organic semiconductor may, for example, be sprayed or spun on. It is also possible to apply the organic semiconductor by printing techniques.

In the above-described method for fabricating the semiconductor arrangement according to the invention, the phosphine itself may be applied to the cleaned surface of the contact, which consists, for example, of palladium. However, it is also possible for the phosphine to be applied to the surface of the contact bound in a metal complex. As has already been described, in solution an equilibrium whereby the phosphine ligands bonded to the metal atom can dissociate off is established in solution. This enables the phosphine ligands either to form a complex with the metal atoms of the contact directly or, for example, allows the metal complex which remains to form a metal—metal bond to a metal atom which is arranged at the surface of the contact. In the metal complexes, the phosphines may either be bonded only to the central metal atom or may have a bridging action. Examples of suitable metal complexes are shown below.

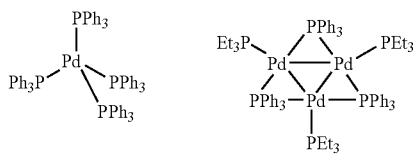

In the embodiment of the method described above, the contacts were first deposited, and, following a treatment with the phosphine, the layer of the organic semiconductor material was applied to the contacts. However, it would also be possible for the layer of the organic semiconductor material to be deposited first and for the contacts then to be defined on this layer. In general, however, it is difficult to pattern the contacts if they are arranged on the layer of the organic semiconductor material. This has an adverse effect on the conductivity or charge carrier mobility of the organic semiconductor layer and on the reproducibility of the properties of the semiconductor devices illustrated. Therefore, it is preferable for the contacts to be produced first and for the organic semiconductor material to then be deposited on the contacts so as to define the organic semiconductor path.

Figure 1C:
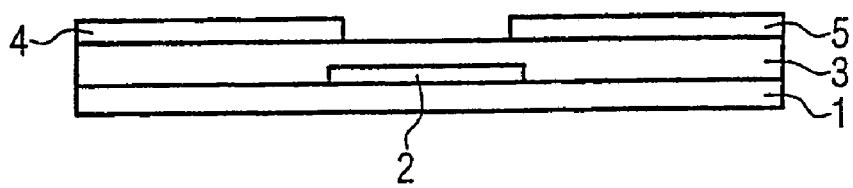

FIGS. 1A–1E depict a sequence of method steps that result in the fabrication of a field-effect transistor of the semiconductor device according to the invention. First of all, as shown in FIG. 1A, a gate electrode 2 is defined on a substrate 1. By way of non-limiting example, palladium is deposited on the substrate 1, for example a polymer film, and this layer is then patterned by photolithographic techniques to form the gate electrode 2. The gate electrode 2 is then insulated by a layer of, for example, silicon dioxide being applied as gate dielectric 3. This results in the arrangement illustrated in FIG. 1B. Then, the source electrode 4 and the drain electrode 5 are defined on the gate dielectric 3. For example, palladium is deposited, and this layer is then patterned by photolithographic techniques, in order, as illustrated in FIG. 1C, to obtain sections of palladium which correspond to the source electrode 4 and the drain electrode 5.

Figure 1D:
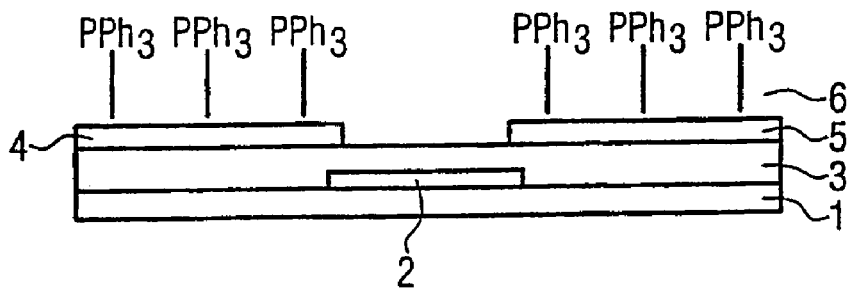
Figure 1E:
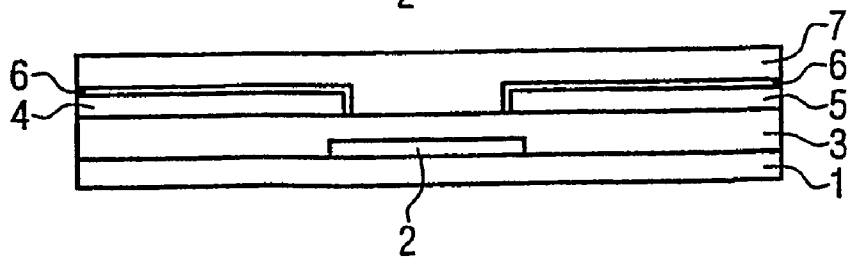

Then, a solution of a phosphine in a suitable solvent is applied to the surface formed from the surfaces of the source electrode 4, of the drain electrode 5 and of the gate dielectric 3, and this solution is left there for a certain time, so that the phosphine molecules from the solution can diffuse to the uncovered surfaces of the source electrode 4 and the drain electrode 5 where they are bonded in place. Finally, excess solvent and unbonded phosphine are removed, for example by rinsing with a suitable solvent followed by drying (e.g., using a stream of nitrogen). The result, as illustrated in FIG. 1D, is an arrangement in which phosphine molecules which form a monomolecular layer 6 are bonded to the surfaces of the source electrode 4 and of the drain electrode 5. Finally, as illustrated in FIG. 1E, a layer of an organic semiconductor 7 is applied, covering the source and drain electrodes (4, 5), which have been provided with the monomolecular layer 6, and the section of the gate dielectric 3 which is arranged between these electrodes.

EXAMPLE 1

A flexible polyethylene naphthalate film is cleaned with acetone and isopropanol, and then a thin film of titanium is deposited on the film. The layer of titanium is patterned by photolithography and wet-chemical etching in dilute hydrofluoric acid in order to define the gate electrodes of the transistors. Then, a thin film of silicon dioxide as gate dielectric for the transistors is deposited by cathode sputtering and is patterned by photolithography and wet-chemical etching. Then, palladium is deposited either by thermal evaporation coating, by electron evaporation coating or by cathode sputtering and is likewise etched by photolithography and wet-chemical etching in a very dilute mixture of hydrochloric acid and nitric acid in order to define the source and drain contacts of the transistors. The substrate, having been prepared in this manner, is immersed in a 5% strength solution of triphenylphosphine xylene for 5 minutes in order to cover the palladium surfaces with a monolayer of triphenylphosphine. Excess triphenylphosphine is washed off in a rinsing step using hexane. After the substrate has been dried, a thin film of pentacene as organic semiconductor layer is deposited by means of thermal evaporation coating.

EXAMPLE 2

Example 1 was repeated, except that a commercially available solution of triphenylphosphine in toluene was used instead of a solution of triphenylphosphine in xylene.

EXAMPLE 3

Example 1 was repeated, except that tetrakis(triphenylphosphino)palladium(0) was used instead of triphenylphosphine.

EXAMPLE 4

Example 1 was repeated, except that tetrakis(triphenylphosphino)platinum(0) was used instead of triphenylphosphine.

While the invention has been described in detail and with reference to specific embodiments thereof, it is believed that other modifications, variations and changes will be suggested to those skilled in the art in view of the teachings set forth herein. It is therefore to be understood that all such variations, modifications and changes are believed to fall within the scope of the present invention as defined by the appended claims and their equivalents.

What is claimed is:

1. A semiconductor device comprising:
   a semiconductor path, the semiconductor path comprising an organic semiconductor material;
   a first contact to inject charge carriers into the semiconductor path;
   a second contact to extract charge carriers from the semiconductor path; and
   a self-organizing monomolecular layer including phosphine, wherein the layer is arranged between the first contact and the semiconductor path and/or between the second contact and the semiconductor path.

2. The semiconductor device of claim 1, wherein the self-organizing monomolecular layer includes a phosphine metal complex.

3. The semiconductor device of claim 2, wherein the phosphine metal complex includes palladium or platinum.

4. The semiconductor device of claim 1, wherein the first and/or second contact comprises palladium.

5. The semiconductor device of claim 1, further comprising a gate electrode and a gate dielectric that form a field-effect transistor.

* * * * *